United States Patent
Hatano et al.

(10) Patent No.: US 7,990,001 B2
(45) Date of Patent: Aug. 2, 2011

(54) STRUCTURE OF MOTOR TERMINAL

(75) Inventors: Kenta Hatano, Tokyo (JP); Naoki Miyamoto, Tokyo (JP); Toshiyuki Umemoto, Tokyo (JP); Hirofumi Doi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 12/524,386

(22) PCT Filed: Oct. 30, 2007

(86) PCT No.: PCT/JP2007/071119
§ 371 (c)(1),
(2), (4) Date: Jul. 24, 2009

(87) PCT Pub. No.: WO2008/102482
PCT Pub. Date: Aug. 28, 2008

(65) Prior Publication Data
US 2010/0007228 A1 Jan. 14, 2010

(30) Foreign Application Priority Data
Feb. 19, 2007 (JP) ................................. 2007-038066

(51) Int. Cl.
*H02K 11/00* (2006.01)

(52) U.S. Cl. ......................................................... 310/71
(58) Field of Classification Search .................... 310/47, 310/50, 68 R, 71
See application file for complete search history.

(56) References Cited

U.S. PATENT DOCUMENTS
5,119,466 A * 6/1992 Suzuki .......................... 388/831

FOREIGN PATENT DOCUMENTS
| JP | 11-18392 A | 1/1999 |
| JP | 2005-304203 A | 10/2005 |
| JP | 2007-37211 A | 2/2007 |

* cited by examiner

*Primary Examiner* — Tran N Nguyen
(74) *Attorney, Agent, or Firm* — Birch, Stewart, Kolasch & Birch, LLP

(57) ABSTRACT

A terminal structure for a vehicle-mounted motor includes a motor body having a motor terminal 28 connected to a coil, and a circuit body 5 holding a circuit board 18 for controlling a rotation of the motor body and is assembled in the motor body, wherein a stress relaxation section 35 is provided in an intermediate of an intermediate conductor 34, in order to reduce stress acting on the intermediate conductor 34 connecting the motor terminal 28 and the circuit board 18 and to thereby improve the conductive reliability of electrical joint.

7 Claims, 2 Drawing Sheets

STRUCTURE OF MOTOR TERMINAL

TECHNICAL FIELD

The present invention relates to a structure of a motor terminal which provides improved reliability of an electrical joint of the terminal.

BACKGROUND ART

In an opening adjustment system of a turbocharger vane and an exhaust gas recirculation system which are incidentally provided in an engine of an automobile or the like, a motor is used for a vehicle-mounted actuator for driving those systems. The vehicle-mounted actuator is integrally assembled with the motor and is disposed in the environment to which heat is transmitted from the engine.

The motor comprises a motor body including a coil of which winding is wound in plural phases and a motor terminal for connecting a conducting wire from the coil to the outside; and a circuit body, which holds a circuit board having circuits mounted thereon for supplying an electric signal to the motor body and is assembled in the motor body. In the circuit, energizing conditions such as the amount of electric current supplied to the coil or the like are determined, thereby driving the motor by a predetermined rotational angle in the predetermined rotational direction. These rotational angle and the rotational direction of the motor are converted into a traveling direction and a traveling distance of an output shaft incidentally provided in the motor, and an exhaust gas recirculation valve is controlled according to how the output shaft travels.

In such a motor, the circuit board is fixed on the circuit body made of resin. Under the circumstances where the circuit body is assembled in the motor body, it is arranged such that the circuit board and the motor terminal are electrically connected to each other through an intermediate conductor.

As described above, the vehicle-mounted actuator including the motor is disposed in the environment to which heat is transmitted from the engine, and thus the circuit body repeats thermal expansion and contraction with a change in the environmental temperature depending on startup and stop of the engine. This leads the intermediate conductor to be subjected to repeated thermal stresses by the circuit body. Therefore, the repeated thermal stresses give rise to trouble that electrical connection status between the motor terminal and the intermediate conductor becomes instable. Further, due to the nature of the vehicle-mounted motor, the repeated stresses caused by vibration can also become a factor destabilizing the electrical connection.

Here, there exists an example in which one end of a male terminal of which the other end is integrally formed with a first insulator is inserted in and held by a female terminal integrally formed with a second insulator (e.g. see Patent Document 1). However, there is no disclosure fearing influence on the electrical connection status by the thermal stress, nor disclosure of a stress relaxation section.

When a motor is used for vehicle-mounting purpose, reliability is needed for external factors including thermal stress and vibration; however, there has been hitherto not under the necessity of providing a stress relaxation section in an intermediate conductor. Thus, there has been some fear that stresses caused by heat and vibration are applied on the intermediate conductor, which might degrade the reliability of the electrical joint.

Patent Document 1: JP-A1999-018392 (see paragraphs 0044 to 0046)

The present invention has been made to solve the above-mentioned problems, and an object of the present invention is to provide a structure of a motor terminal which provides improved conductive reliability of the electrical joint of an intermediate conductor.

DISCLOSURE OF THE INVENTION

According to the present invention, there is provided a structure of a motor terminal, comprising a motor body including a coil of which winding is wound in plural phases and a male terminal functioning as a motor terminal for connecting a conducting wire from the coil to the outside; a circuit body holding a circuit board on which circuits for supplying an electric signal to the motor body are mounted and is assembled in the motor body by fitting the male terminal in a female terminal formed therein; and an intermediate conductor of which one end is struck fast to the circuit board to provide electrical connection and of which the other end is electrically connected integrally with the female terminal of the circuit body; wherein the intermediate conductor has a stress relaxation section between the one end and the other end thereof.

According to the present invention, since the stress relaxation section relaxes the stresses caused by heat, vibration etc. reliability degradation of the electrical connection attributable to those stresses can be avoided.

BEST MODE FOR CARRYING OUT THE INVENTION

Figure 1:
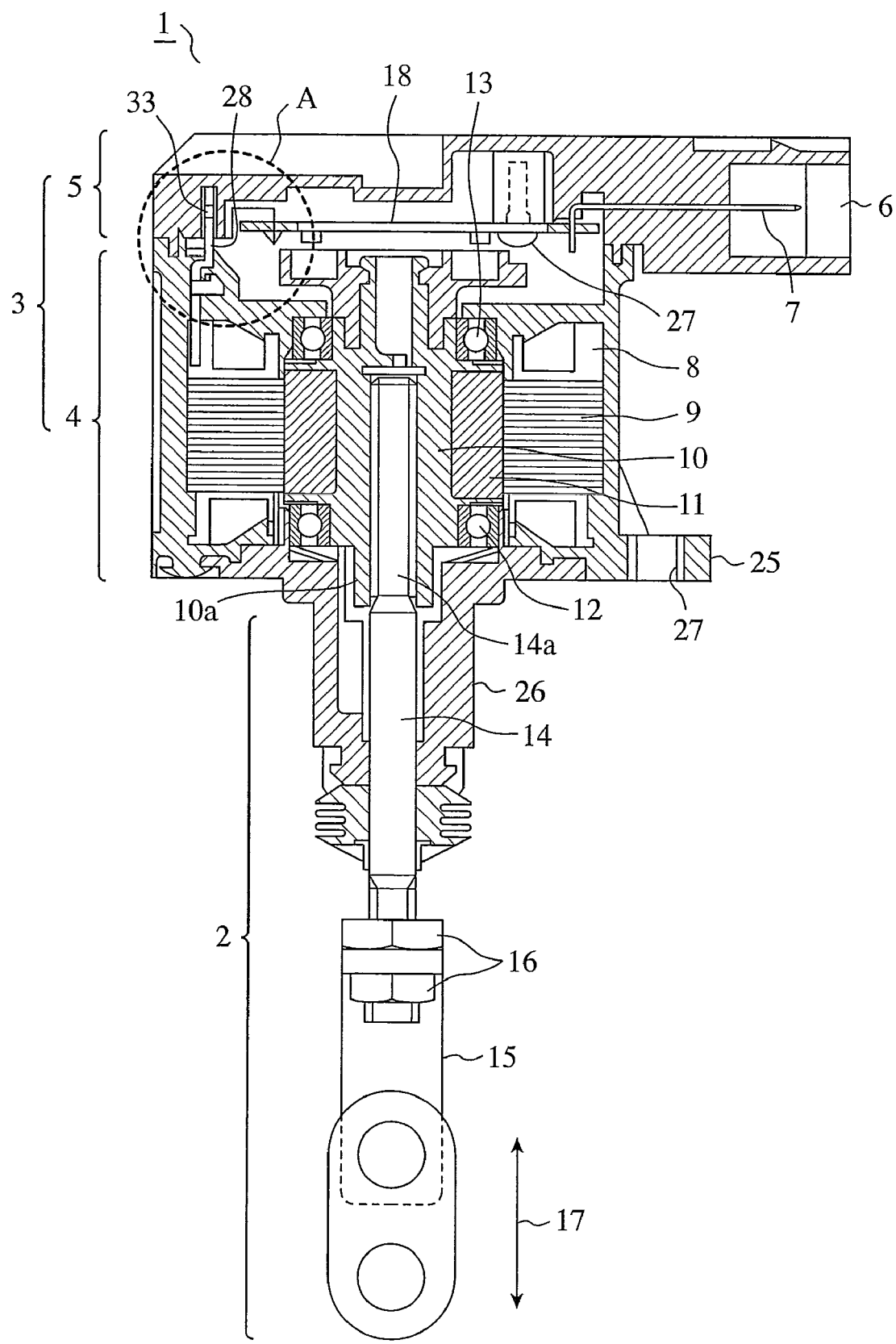
FIG. 1 is a sectional view of a vehicle-mounted actuator including a motor.

Embodiments of the present invention will now be described with reference to the accompanying drawings in order to explain the present invention in more detail.

First Embodiment

Before explaining a structure of a motor terminal, the rough structure of a vehicle-mounted actuator including a motor according to the embodiment will be described referring to FIG. 1. A vehicle-mounted actuator 1 is broadly composed of an actuator 2 and a motor 3 for driving the actuator 2, and further, the motor 3 is made up of a motor body 4 and a circuit body 5 for driving the motor.

The circuit body 5 includes an external input-and-output connector 6, a terminal 7, a circuit board 18 connected with the terminal 7, and other components, and is assembled in the motor body 4. The circuit board 18 includes circuits (e.g. control circuit) for supplying electrical signals to the motor body. The circuit board 18 is fixed with a screw 27 to the circuit body 5 at one end thereof. The motor body 4 includes a stator 8 polarized into plural poles; a coil 9 of which winding is wound in plural phases around the stator 8; a rotor 10; a magnet 11 rotating in a body with the rotor 10; bearings 12, 13 supporting the rotor 10; a base 25; a cylindrical supporting section 26 slidably supporting an output shaft 14 in a body with the base 25; and other components. The base 25 is provided with a mounting hole 27. The vehicle-mounted actuator 1 is disposed in an engine room with the base 25 fixed on a bracket (not shown).

The actuator 2 is a section for driving the output shaft 14, and a male screw 14a provided on the base end of the output shaft 14 is screwed into a female screw 10a cut at the center of a shaft in the rotor 10. The output shaft 14 has a joint 15 for coupling, secured with a nut 16 on the extremity thereof, for driving a valve, a lever, and other parts that are objects to be driven.

An explanation is given hereinafter of the operation of the actuator. Application of voltage to the terminal 7 feeds current through the coil 9 by the amount of current controlled by the circuit of the board 18, magnetizing the stator 8. Thereby, the magnet 11 magnetized to an N-pole and an S-pole rotates together with the rotor 10. With regular and reverse rotations of the rotor 10, the output shaft 14 that is whirl-stopped by an anti-rotation stopping means (not shown) reciprocates as shown by arrow 17 according to the predetermined rotational angle, so-called, by a screwing relation between a nut and a screw, thus operating the objects to be driven.

Figure 2:
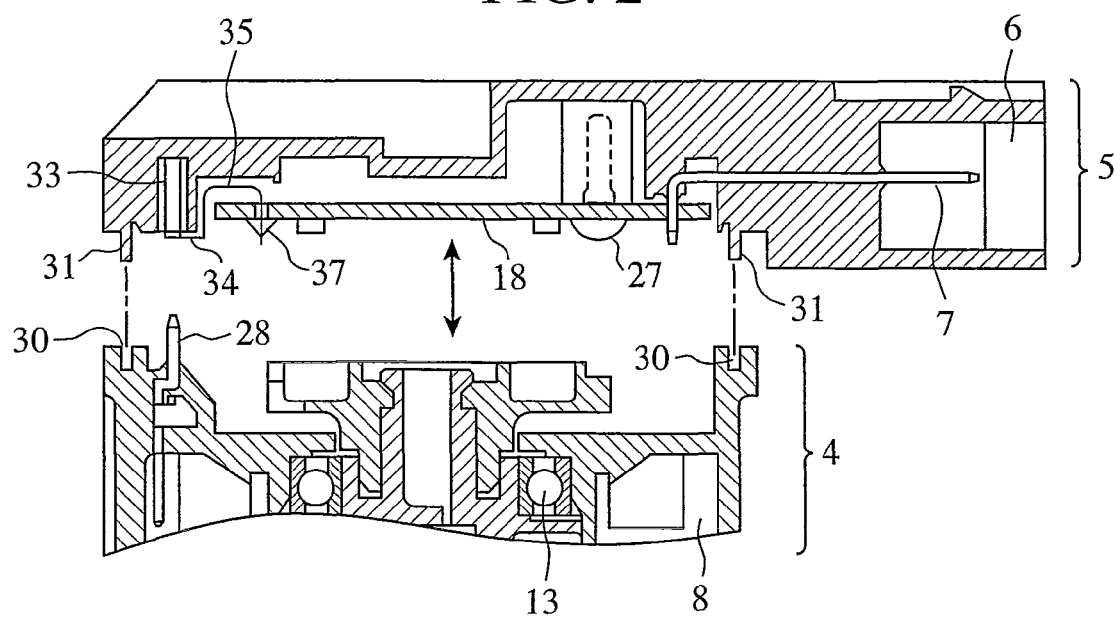
FIG. 2 is a partially enlarged sectional view of a principal part of the actuator shown in FIG. 1 according to the present invention.

A portion (upper part) of the motor body 4 shown in FIG. 1 and the circuit body 5 assembled therein are shown on a large scale in FIG. 2. Further, in FIG. 2, a concavity 30 for fitting is formed on the upper end of the motor body 4, whereas a convexity 31 fitting with the concavity 30 is formed on the lower end of the circuit body 5. By fitting the convexity 31 with the concavity 30 each other, the circuit body 5 is assembled in the motor body 4.

Figure 3:
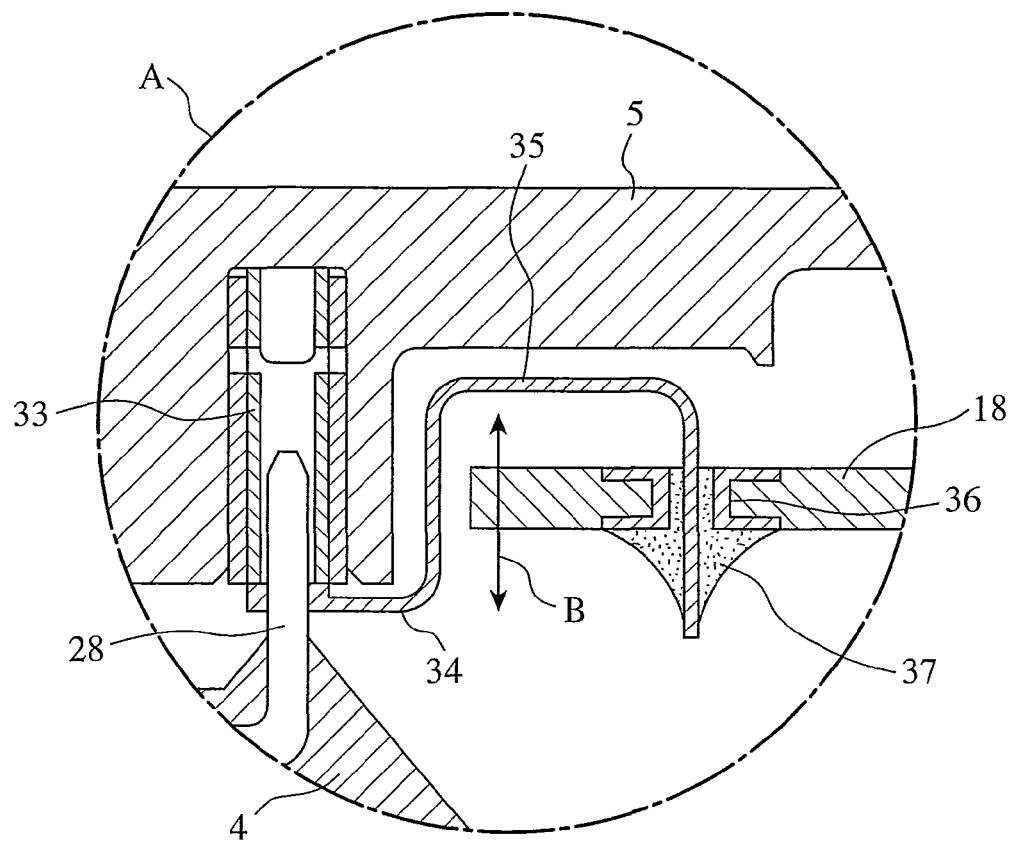
FIG. 3 is a partially enlarged view of the portion indicated by circle A in FIG. 1.

The upper end of the motor body 4 has a male terminal 28 projecting therefrom, as a motor terminal electrically connected with a conducting wire from the coil 9, and the lower end of the circuit body 5, opposed to the upper end thereof, has a female terminal 33 fitting with the male terminal 28, and being held by a resin constituting the circuit body 5. In FIG. 1, assembling the circuit body 5 in the motor body 4 brings the male terminal 28 and the female terminal 33 into a fitting state, thereby achieving an electrical connection between them. In FIG. 1, electrical joint is shown by circle A, and FIG. 3 shows on a large scale the joint encircled by circle A. The embodiment will be discussed properly referring to FIG. 1 to FIG. 3.

The circuit board 18 has an intermediate conductor 34 stuck fast thereto at the one end of the conductor and electrically connected to circuits on the circuit board. The other end of the intermediate conductor 34 is electrically connected with the female terminal 33, integrally with or separately from the terminal. Under the circumstances where the circuit body 5 is assembled in the motor body 4, the male terminal 28 fits with the female terminal 33 to provide electrical connection, and at the same time, is also electrically connected with the intermediate conductor 34 through the female terminal 33. This allows the voltage brought in from the terminal 7 of the external input-and-output connector 6 to pass through the circuits on the circuit board 18, and further to supply to the male terminal 28 and the coil 9 through the intermediate conductor 34 and the female terminal 33.

The intermediate conductor 34 is provided with a stress relaxation section 35 between the one end and the other end of the conductor, for absorbing stresses caused by heat and vibration. Both ends of the intermediate conductor 34 are secured to the circuit board 18 and the circuit body 5, respectively. Although the circuit board 18 is fixed at the one end thereof to the circuit body 5 with the screw 27, there is a difference between the fixed part and a mounting part of the female terminal 33 e.g. in their thickness of resin constituting the circuit body 5. The difference brings about the different amount of thermal expansion due to heat from the engine, resulting in that the intermediate conductor 34 is suffered from repeated thermal stresses e.g. in the direction of arrow B.

Leaving such a situation as it is comes to creation of a crack or the like due to the temporally repeated stresses e.g. in the fitting part between the female terminal 33 and the male terminal 28, which is threatened with imperfection of the electrical connection therebetween. The provision of the stress relaxation section 35 absorbs the thermal stress, and the fitting part is not resultingly subjected to excess stress thereon, which can achieve the improvement of the reliability and the durability of the electrical joint. Further, the stuck part (e.g. stuck by soldering) where the one end of the intermediate conductor 34 is stuck to the circuit board 18 is also free from immoderate stress. Moreover, similar imperfections of electrical connection caused by vibration can also be avoided.

First Example

To be more exact, the stress is absorbed by taking the stress relaxation section 35 as a spring-like section. Using conductive elastic materials or forming the section in thin strip-shape realizes springiness.

Second Example

When the thermal stress acts between the circuit body 5 and the intermediate conductor 34 in the direction of arrow B as shown in FIG. 3, it should be arranged for the stress relaxation section to have elasticity in the direction where the thermal stress in the direction of arrow B is absorbed. By way of example, the stress relaxation section is formed from a bend in L-shape or S-shape as illustrated.

Third Example

Alternatively, the spring-like section may be formed integrally with the intermediate conductor 34 at an intermediate by connecting another materials and forms, or may be formed as one body with the intermediate conductor 34. Further, the intermediate conductor 34 may be formed fast integrally with the female terminal 33, or may be stuck to the female terminal 33. Out of these options, taking a structure where the intermediate conductor is formed integrally with the female terminal 33 allows easy fabrication of it including the stress relaxation section 35 by press processing, becoming thereby possible to improve the productivity and cut the cost.

Furthermore, when the end of the intermediate conductor and the female terminal 33 are formed integrally with each other, an increase in resistance at the joint can be suppressed as compared with the case where they are connected, thus reducing voltage loss and improving the reliability of the electrical connection.

Fourth Example

As for sticking manner of the one end of the intermediate conductor 34 to the circuit board 18, a structure in which an electrical connection may be done by soldering via a through hole 36 which ensures the connection by insertion of the conductor into a metal pipe as shown in FIG. 3. This secures strong connection and good electrical connection.

In parenthesis, on the occasion of soldering lead-free solder is employed. With the reduction in the stress to the soldering bonds by the virtue of the provision of the stress relaxation section 35, it becomes possible to use a lead-free solder 37 for soldering, which is environmentally excellent.

Fifth Example

In the above-mentioned examples, while the descriptions are made to the case where the female terminal 33 is provided on the circuit body 5 side and the male terminal 28 is provided on the motor body 4 side, working is also feasible in the case where the male terminal is provided on the circuit body 5 side and the female terminal is provided on the motor body 4 side, correspondingly to the examples described above.

In the above examples, the explanations are given of the structure where the circuit board 18 is located below the circuit body 5. Contrariwise, in the case of a structure where the circuit board 18 is located above the circuit body 5, the intermediate conductor 34 passes through the circuit body 5 and is electrically connected to the circuit board 18. Even in that case, the same effect as that of the above examples can be obtained by providing the stress relaxation section within the intermediate conductor 34.

INDUSTRIAL APPLICABILITY

As described above, the structure of the motor terminal according to the present invention is suitable, e.g., for the motor use for in the vehicle-mounted actuator because the structure has the intermediate conductor provided with the stress relaxation section, thereby providing the improved reliability of the electrical joint between the motor terminal and the intermediate conductor.

The invention claimed is:

1. A structure of a motor terminal comprising;
   a motor body including a coil, where a winding of said coil is wound in plural phases, and including a male terminal functioning as a motor terminal for connecting a conducting wire from the coil to the outside;
   a circuit body holding a circuit board, said board having circuits mounted thereon for supplying an electric signal to the motor body, where said circuit body is assembled in the motor body by fitting the male terminal in a female terminal; and
   an intermediate conductor having a first end and a second end, where the first end is affixed to the circuit board to provide electrical connection and where the second end is electrically connected integrally with the female terminal of the circuit body;
   wherein the intermediate conductor includes a stress relaxation section between the first end and the second end.

2. The structure of the motor terminal as claimed in claim 1, wherein the stress relaxation section is configured to act as a spring.

3. The structure of the motor terminal as claimed in claim 2, wherein the stress relaxation section is configured so as to have elasticity in a direction where said stress relaxation section absorbs thermal stress acting between the circuit body and the intermediate conductor.

4. The structure of the motor terminal as claimed in claim 3, wherein the stress relaxation section is a bend provided within the intermediate conductor.

5. The structure of the motor terminal as claimed in claim 2, wherein the stress relaxation section is provided integrally with the intermediate conductor.

6. The structure of the motor terminal as claimed in claim 1 wherein the intermediate conductor is affixed to the circuit board via a through hole provided in the circuit board.

7. The structure of the motor terminal as claimed in claim 6, wherein the intermediate conductor is affixed to the circuit board with lead-free solder.

* * * * *